(12) United States Patent
Alexanian et al.

(10) Patent No.: US 8,020,124 B2
(45) Date of Patent: Sep. 13, 2011

(54) VARIOUS METHODS AND APPARATUSES FOR CYCLE ACCURATE C-MODELS OF COMPONENTS

(75) Inventors: Herve Alexanian, San Jose, CA (US); Chien-Chun Chou, Saratoga, CA (US); Vida Vakilotojar, Mountain View, CA (US); Grigor Yeghiazaryan, Yerevan (AM)

(73) Assignee: Sonics, Inc., Milpitas, CA (US)

( * ) Notice: Subject to any disclaimer, the term of this patent is extended or adjusted under 35 U.S.C. 154(b) by 475 days.

(21) Appl. No.: 12/122,988

(22) Filed: May 19, 2008

(65) Prior Publication Data

US 2008/0263486 A1 Oct. 23, 2008

Related U.S. Application Data

(63) Continuation-in-part of application No. 11/561,815, filed on Nov. 20, 2006, now abandoned, and a continuation-in-part of application No. 11/653,648, filed on Jan. 12, 2007.

(60) Provisional application No. 60/940,645, filed on May 29, 2007.

(51) Int. Cl.
*G06F 17/50* (2006.01)

(52) U.S. Cl. .......................... 716/106; 716/108; 716/100

(58) Field of Classification Search .................. 716/106, 716/108, 100
See application file for complete search history.

(56) References Cited

U.S. PATENT DOCUMENTS

| | | | |
|---|---|---|---|
| 5,948,089 A | 9/1999 | Wingard et al. | |
| 6,182,183 B1 | 1/2001 | Wingard et al. | |
| 6,182,258 B1 | 1/2001 | Hollander | |
| 6,683,474 B2 | 1/2004 | Ebert et al. | |
| 6,701,504 B2 | 3/2004 | Chang et al. | |
| 6,725,313 B1 | 4/2004 | Wingard et al. | |
| 6,785,753 B2 | 8/2004 | Weber et al. | |
| 6,816,814 B2 | 11/2004 | Ebert et al. | |
| 6,845,341 B2 | 1/2005 | Beverly et al. | |
| 6,880,133 B2 | 4/2005 | Meyer et al. | |
| 6,941,538 B2 * | 9/2005 | Hwang et al. | 716/102 |
| 7,050,958 B1 | 5/2006 | Bortfeld et al. | |
| 7,085,702 B1 * | 8/2006 | Hwang et al. | 703/15 |
| 7,194,566 B2 | 3/2007 | Wingard et al. | |
| 7,194,658 B2 | 3/2007 | Staton et al. | |
| 7,266,786 B2 | 9/2007 | Chou et al. | |

(Continued)

OTHER PUBLICATIONS

U.S. Appl. No. 11/203,554, Aug. 11, 2005, Chou et al.

(Continued)

*Primary Examiner* — Jack Chiang
*Assistant Examiner* — Magid Dimyan
(74) *Attorney, Agent, or Firm* — Rutan & Tucker, LLP

(57) ABSTRACT

Various methods and apparatuses are described for generating a model of hardware components making up an interconnect that facilitates communications between Intellectual Property blocks in an integrated circuit coded in a software programming language at a high level of abstraction that is cycle accurate to a corresponding lower level of abstraction description of the hardware components making up the interconnect. The sub-components of the model at the high level of abstraction are tested in a simulation environment in parallel with the same sub-components of a model coded in a hardware description language at the low level of abstraction in order to verify the functional accuracy and cycle timing between the two models. After the sub-components are tested, the sub-components of the model at the high level of abstraction may be aggregated into a single model at the high level of abstraction that is functionally accurate and cycle accurate to the model at the low level of abstraction.

15 Claims, 8 Drawing Sheets

U.S. PATENT DOCUMENTS

| | | | |
|---|---|---|---|
| 7,325,221 | B1 | 1/2008 | Wingard et al. |
| 7,596,144 | B2 | 9/2009 | Pong |
| 7,684,968 | B1 * | 3/2010 | Szedo et al. ............... 703/14 |
| 2002/0188432 | A1 * | 12/2002 | Houlihane et al. ............ 703/20 |
| 2004/0153928 | A1 | 8/2004 | Rohrbaugh et al. |
| 2005/0144585 | A1 | 6/2005 | Daw et al. |
| 2006/0225015 | A1 | 10/2006 | Synek et al. |
| 2006/0242525 | A1 | 10/2006 | Hollander et al. |
| 2007/0083830 | A1 | 4/2007 | Hamilton et al. |
| 2009/0150136 | A1 * | 6/2009 | Yang ............................ 703/13 |

OTHER PUBLICATIONS

Alexanian, H., Bolden, G., Amir, Z., "Simplifying the Behavior of System C Descriptions for Hardware/Software Covalidation," copyright 2005 [retrieved Apr. 26, 2008] Retrieved from the Internet. <URL: www.ocpip.org/pressroom/schedule/speaking/papers_presentations/Summit_OCP-IP_pavillion_pres.pps>.

Chou, Joe, et al, "System-Level Design Using OCP Based Transaction-Level Models" Denali MemCon Taiwan, Mar. 15, 2005, 23 pages.

Haverinen, Anssi, et al, SystemC™ based SoC Communication Modeling for the OCP™ Protocol, V1.0, Oct. 14, 2002, 39 pages.

Robert Siegmund, et al., "SystemCSV: An Extension of SystemC for Mixed Multi-Level Communication Modeling and Interface-Based System Design", 2001, IEEE, pp. 1-7.

Cottrell, Donald, Chapter 78: "Design Automation Technology Roadmap", The VLSI Handbook, Copyright 2000, 41 Pages.

Hurst, Stanley L., Chapter 5: "Computer Aided Design", VLSI Custom Microelectronics: Digital, Analog, and Mixed-Signal, Copyright 1999, 95 pages.

Sofiene Tahar, "Assertion and Model Checking of SystemC", hardware Verification Group, Department of Electrical and Computer Engineering, Concordia University Montreal, Quebec, Canada, First Annual North American SystemC Users Group (NASCUG) Meeting, Jun. 7, 2004, pp. 28.

Alan Kamas, "Dot.Org—Open Core Protocol: The SystemC Models" article, published in Apr./May 2004 issue of Chip Design Magazine, http://www.chipdesignmag.com/print/php?articleld=28?issueId=4, pp. 2.

Alan Kamas, "The SystemC OCP Models, an Overview of the SystemC Models for the Open Core Protocol", NASCUG Sep. 29, 2004, Copyright alan Kamas 2004, www.kamas_com, pp. 30.

2nd NASCUG Meeting Agenda, Meeting Presentations, GSPx 2004, Santa Clara, CA U.S.A., Sep. 29, 2004, http://www.nascug.org/nascug2004_fall.agenda.html, North American SystemC Users Group, pp. 2.

Hardware Verification Group, "SystemC Verification Problematic", System-on-Chip Verification <http://hvg.ece.concordia.ca/Research/SoC/>, 2004, pp. 26.

SOCCentral.com, "Error Checking and Functional Coverage with SystemVerilog Assertions", http://soccentral.com/results.asp?CatID=488&EntryID=21594, Feb. 2, 2007, 5 pages.

M. Caldari et al. "Transaction-Level Models for AMBA Bus Architecture Using System C 2.0", 2003, IEEE, p. 1-6.

Non-Final Office Action for U.S. Appl. No. 12/122,988 mailed Dec. 9, 2010, 15 pages.

PCT International Search Report and Written Opinion, International application No. PCT/US07/84980, 7 pages, mailed May 20, 2008.

\* cited by examiner

VARIOUS METHODS AND APPARATUSES FOR CYCLE ACCURATE C-MODELS OF COMPONENTS

RELATED APPLICATIONS

This application claims priority to and incorporates in by reference as a Continuation In Part of: U.S. patent application Ser. No. 11/561,815, filed on Nov. 20, 2006, titled TRANSACTION CO-VALIDATION ACROSS ABSTRACTION LAYERS, U.S. patent application Ser. No. 11/653,648, filed on Jan. 12, 2007, titled TRANSACTION CO-VALIDATON ACROSS ABSTRACTION LAYERS, and U.S. Provisional Patent Application titled 'VARIOUS METHODS AND APPARATUSES FOR CYCLE ACCURATE C-MODELS OF COMPONENTS,' filed on May 29, 2007, U.S. Ser. No. 60/940,645.

NOTICE OF COPYRIGHT

A portion of the disclosure of this patent document contains material that is subject to copyright protection. The copyright owner has no objection to the facsimile reproduction by anyone of the software engine and its modules, as it appears in the Patent and Trademark Office Patent file or records, but otherwise reserves all copyright rights whatsoever.

FIELD OF THE INVENTION

Aspects of embodiments of the invention generally relate to Integrated Circuit design and simulation.

BACKGROUND OF THE INVENTION

In integrated circuit design, a Register Transfer Level (RTL) description is a way of describing the operation of a synchronous digital circuit at a low level that essentially matches the gate level components making up the electronic component in the integrated circuit and is synthesizable to produce a hardware representation of that RTL description. In RTL design, a circuit's behavior is defined in terms of the flow of signals (or transfer of data) between hardware registers, and the logical operations performed on those signals. Register transfer level abstraction is used in hardware description languages (HDLs) like Verilog and VHDL to create high-level representations of a circuit, from which lower-level gate representations and ultimately actual wiring can be derived. SystemC is often thought of as a hardware description language like VHDL and Verilog, but is more aptly described as a system description software programming language, since it exhibits its real power during transaction-level modeling and behavioral modeling.

Transaction-level modeling (TLM) is a high-level approach to modeling digital systems where details of communication among modules are separated from the details of the implementation of functional units or of the communication architecture. A transaction-level model can be a software-coded model of a circuit or a system where data transfers are simplified and abstracted. Transaction Layer 1 modeling refers to a level of detail where the data is passed in packet structures and the protocol is modeled accurately during active transfer phases only. Transaction Level is simply a level where individual signals are represented in the software-coded model in a way that can be mapped directly to corresponding signals in a RTL description.

SUMMARY OF THE INVENTION

Various methods and apparatus for a model of hardware components making up an interconnect that facilitates communications between Intellectual Property blocks in an integrated circuit coded in a software programming language at or above a Transaction Layer 1 level (TL1) that is cycle accurate to a corresponding Register Transfer Level (RTL) description of the hardware components making up the interconnect. The software programming language model of the interconnect at or above the Transaction Layer 1 level is made up of two or more individual models. Each model has one or more of the hardware components making up the interconnect which were simulated and verified at the same time with a corresponding individual model coded in a hardware description language at RTL of those one or more hardware components making up the interconnect. A TL1-to-TL0 adapter may wrap around each individual model of the one or more hardware components making up an interconnect coded in the software programming language at TL1 in order to provide output signals that may be checked to compare the cycle accuracy to the model of the one or more hardware components making up an interconnect coded in a hardware description language at RTL.

BRIEF DESCRIPTION OF THE DRAWINGS

The drawings refer to embodiments of the invention in which.

Figure 1:
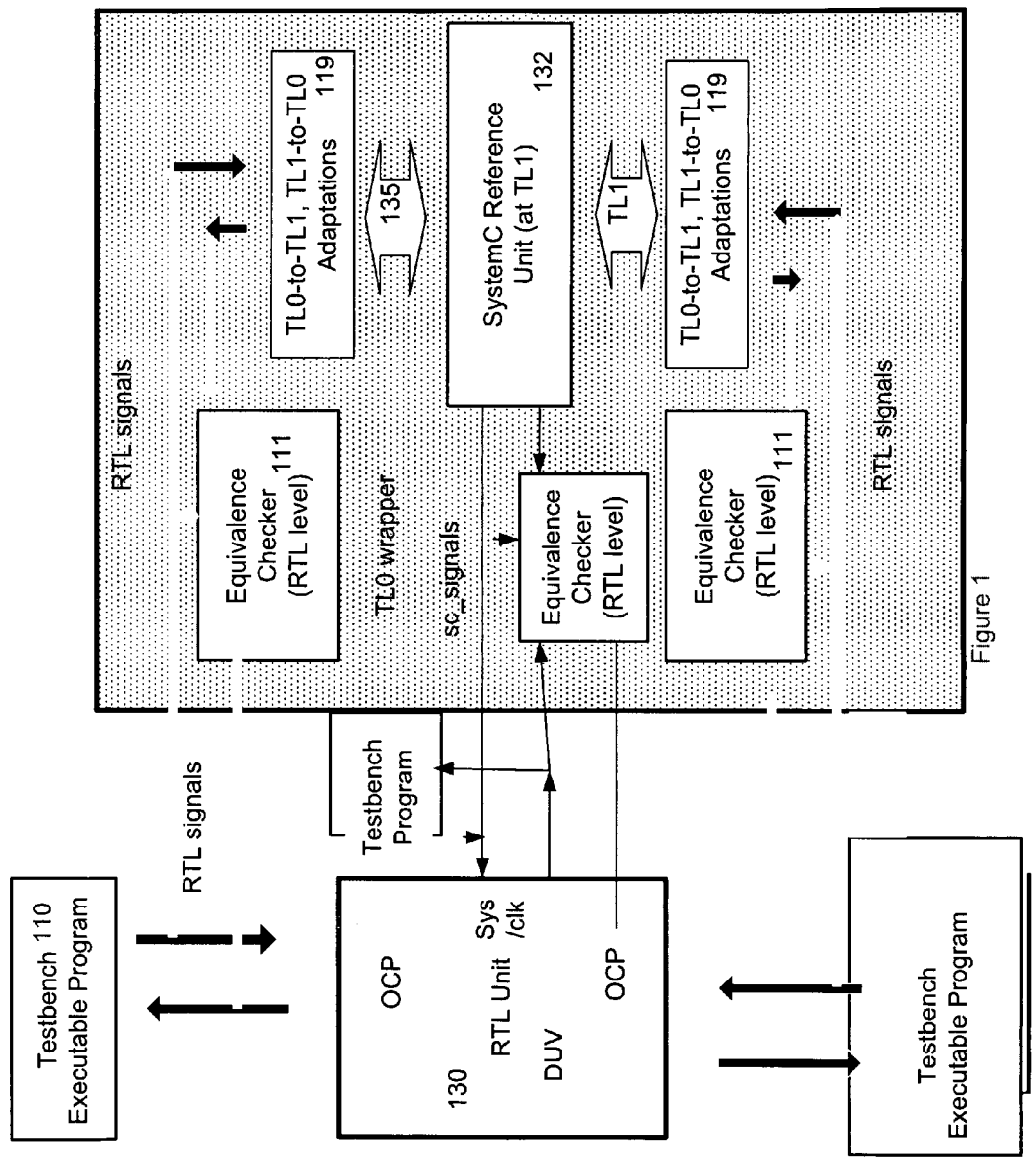
FIG. 1 illustrates an embodiment of a SystemC-based Electronic Design Automation (EDA) modeling tool and unit testbench environment for functional/timing correlation between an RTL description and another cycle accurate description of one or more hardware components making up the interconnect under test.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, programming languages, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as first model, may be made. However, the specific numeric reference should not be interpreted as a literal sequential order but rather interpreted that the first model is different than a second model. Thus, the specific details set forth are merely exemplary. The specific details may be varied from and still be contemplated to be within the spirit and scope of the present invention.

In general, various methods and apparatuses are described for generating a model of hardware components making up an interconnect that facilitates communications between Intellectual Property blocks in an integrated circuit coded in a software programming language at a high level of abstraction that is cycle accurate to a corresponding lower level of abstraction description of the hardware components making up the interconnect. The sub-components of the model at the high level of abstraction are tested in a simulation environment in parallel with the same sub-components of a model coded in a hardware description language at the low level of abstraction in order to verify the functional accuracy and cycle timing between the two models. After the sub-components are tested, the sub-components of the model at the high level of abstraction may be aggregated into a single model at the high level of abstraction that is functionally accurate and cycle accurate to the model at the low level of abstraction. Thus, an example process for and apparatus to provide cycle accurate SystemC-Models of components is described.

The on-chip interconnect may contain a capability to manage end-to-end width conversion between independent initiator Intellectual Property cores data path widths and target Intellectual Property cores data path widths and the interconnect's various components may be modeled and simulated prior to the fabrication of a chip containing the interconnect. The on-chip interconnect introduces a mechanism for allowing such cores to communicate, without either core needing to adapt its behavior. Most of the work is performed in the agents interfacing an IP core to the interconnect.

A transaction-level model can be written in a high-level software language, such as C, C++ or SystemC. RTL may be considered Transaction Level 0 (TL0) and correspond directly with signals such as those defined in the open core protocol specification. Transaction Level 1 (TL1) modeling may correspond to a given protocol's phase level on an individual transfer basis and be cycle accurate. Transaction Level 2 (TL2) modeling may correspond to one or more protocol transfers or transactions at the same time and be transaction accurate but cycle approximate. For example, if a system implements burst data transfers between components, this burst may be expressed using a single function call in the implementation language. The difference in the number of application programming interface calls or events can cause timing inaccuracies between these different levels of abstraction.

FIG. 1 illustrates an embodiment of a SystemC-based Electronic Design Automation (EDA) modeling tool and unit testbench environment for functional/timing correlation between an RTL description and another cycle accurate description of one or more hardware components making up the interconnect under test. The testbench executable program 110 may send stimulus and receive responses to test and verify a first design of one or more hardware components making up the interconnect under verification 130 modeled at a TL1 level of abstraction. The same instance of the testbench executable program 110 may send stimulus and receive responses to test and verify a second design of one or more hardware components making up the interconnect under verification 132 modeled at a RTL level of abstraction. Thus, the sequence of test patterns and expected test results of the testbench executable program 110 are applied to the sub-components of the interconnect design under verification 130, 132 at two or more different levels of abstraction. The testing and verification may occur in parallel. This process may be repeated over and over to test the entire set of components making up the interconnect.

The SystemC-based EDA modeling tool and unit testbench environment is used for the specific purpose of comparing cycle accuracy of two or more levels of abstraction. The sequence of test patterns and expected test results of the testbench executable program 110 are applied to the two models of one or more hardware components making up the interconnect under verification 130, 132. The first level of abstraction may be the RTL level and the second level of abstraction may be TL1 or higher. The sequence of test patterns and expected test results are translated from the abstraction level of the testbench executable program 110 and then applied at a signal level to the two models of one or more hardware components making up the interconnect under verification 130, 132. The RTL input and output signals are then derived to a correlation module where correlation to the reference phase-accurate model TL1 can be established.

Overall, a model of the entire set of all of the hardware components making up an interconnect that facilitates communications between IP blocks in an integrated circuit coded in a software programming language at TL1 is created, tested, and verified to be cycle accurate and functionally accurate to a corresponding RTL description of the hardware components making up the interconnect. The software programming language model of the interconnect at TL1 is made up of two or more individual models of one or more of the hardware sub components making up the interconnect 132 which were simulated and verified at the same time with corresponding individual models coded in RTL of those one or more hardware components making up the interconnect 130.

The hardware sub components making up the interconnect communication bus may include wiring, arbitration logic units, registers and other memory buffering units, logic agents, merger logic units, splitter logic units, etc. Each individual model of one or more hardware components making up an interconnect coded in a software programming language, such as SystemC, at TL1 132 may be wrapped by one or more TL1-to-TL0 wrappers 119 to provide output signals that are checkable to compare the cycle accuracy to the corresponding model of those one or more hardware components making up an interconnect coded at RTL 130.

As discussed, the individual models of those one or more hardware components in SystemC 132 are tested and verified in parallel/at the same time the individual models of those one or more hardware components in RTL 130 are tested. The individual models at the TL1 level 132 are initially verified at the unit/group level and then aggregated together to form the system level model at the TL1 level. Therefore, components inside the final system model of the interconnect represent an additional implementation of the specification (with respect to functionality and cycle timing) and are systematically correlated (e.g., verified) with the hardware RTL counterparts of the interconnect (which is also an implementation of the specification).

This cycle accurate model is different from a C-model extracted from an RTL instance directly or automatically (where errors exist in the RTL will also exist in the extracted C model). Thus, any errors will have been identified and corrected by the time the final version of each individual model of one or more hardware components in the interconnect is aggregated to make a final system model of the interconnect in System C. For a cycle accurate C-model based on given system configuration, a system-level model may be generated by merely aggregating the individually modeled and verified, cycle-accurate SystemC components rather than rewriting any of the specification. Thus, by construction, the SystemC model of the interconnect offers cycle timing accuracy and proper functionality that will match the hardware instance. Accordingly, architects who use the system-level model can precisely predict the performance (BW, latency, and more) and cycle timing of their design alternatives. Thus, the structural assembly of verification components into a system-level model in the cycle accurate C-model technique gives a guarantee on cycle accuracy and functional accuracy. After the aggregate SystemC model of the interconnect is generated, then a designer may use that aggregate SystemC model of the interconnect in a simulation of an entire integrated circuit, such as a System on a Chip, complete with other initiator and target IP cores, see FIG. 6.

In an embodiment, a SystemC TL0 module may contain the equivalence checker 111s, the TL0-TL1 adapter 119, and the TL1 model 132.

An equivalence checker 111 may read two or more data sets, containing responses generated at potentially one or more different levels of abstraction, to requests sent by the testbench executable program 110. The TL0-TL1 adapter 119 may convert all of the signals the equivalence checker 111 compares to the same level of abstraction, such as RTL. The equivalence checker 111 then essentially receives signals from both models 130 and 132. The equivalence checker 111 may then determine an equivalence of the responses found in the two or more data sets for each level of abstraction of the sub-components 130, 132.

A functional/timing correlation between the RTL description and another cycle accurate description of the one or more hardware components making up the interconnect under test can be made, where equivalence is established at a phase abstraction level. Protocol phase definitions allow a precise correlation of a phase abstraction level with an RTL description. The Protocol phase definitions allow the cycle accurate model some abstraction that can be easily reconciled when matching the results.

The two or more data sets for each level of abstraction may constitute functional results, derived from simulations of the sub-components 130, 132 represented at two or more different abstraction levels. The system would then compare the first set of functional results to the second set of functional results when a stimulus from the testbench executable program 110 is generated at a same level of abstraction. For example, the functional results may be the particular behavior of the sub-component to the applied stimulus, such as whether an expected logic value occurs or an expected blocking of a signal occurs, etc.

For levels of abstraction higher than TL1, the system may also compare the functional results and the timing data results because a monitor program may read values stored in a Transaction level channel 135 at the edge of the SystemC model. The values may be temporarily stored in the Transaction level channel 135 during simulation of the sub-components of the interconnect design under verification 132. In an embodiment, the accurate time spans in the transaction flow may be described as the span (latency) between the first request and the first response of a transaction, and the span between the first request and the last response of a transaction. The tool then establishes a figure of merit for the timing correlation based on the mean and deviation of these two statistics.

The system may also complete co-validation by verifying end-to-end checks concurrently with comparing timing results from the sub-components of the electronic system design under verification at different levels of abstraction, 130, 132. This may eliminate the need for an additional validation step of verifying end-to-end checks, such as stimulus inputted into the electronic system to expected results from the electronic system design, at each level of abstraction.

In an embodiment, the end-to-end checks involve the testbench issuing a directed set of transactions to observe a particular response. The simplest case is a write transaction followed by a read transaction of the same length and at the same address to ensure the written data is returned by the read. A more complete approach involves the testbench maintaining an image of the system address space and recording every write into that image and matching every read response with the one expected by the image. The latter approach means the testbench needs full knowledge of the functional specification of the system under test, which is typical and also justifies the testbench as a critical reuse component.

Thus, the EDA modeling tool may be part of a computing system made up of a processor component to execute instructions from the testbench executable program that generate and apply a sequence of test patterns and expected test results to sub-components of a design of an electronic system under verification at two or more levels of abstraction.

In an embodiment, the phase accurate (TL1) model 132 may include clocked modeling, abstracted protocol data, and transfers represented cycle accurately as well as standard protocol signal ports, plain clock ports, and other signal ports. The protocol abstraction includes standard on-chip protocol interfaces (OCP, AMBA . . . ), signal grouping (MCmd/MAddr/MThreadID/MBurst), and elimination of some signals because not all signal transitions are interesting. The pin-level (TL0) model may include SystemC ports to bit or integer types. The Electronic Design Automation tool creates the systematic pin-Level Wrapping adapter 119 with code to automatically create protocol ports to convert between TL0 and TL1.

Figure 2:
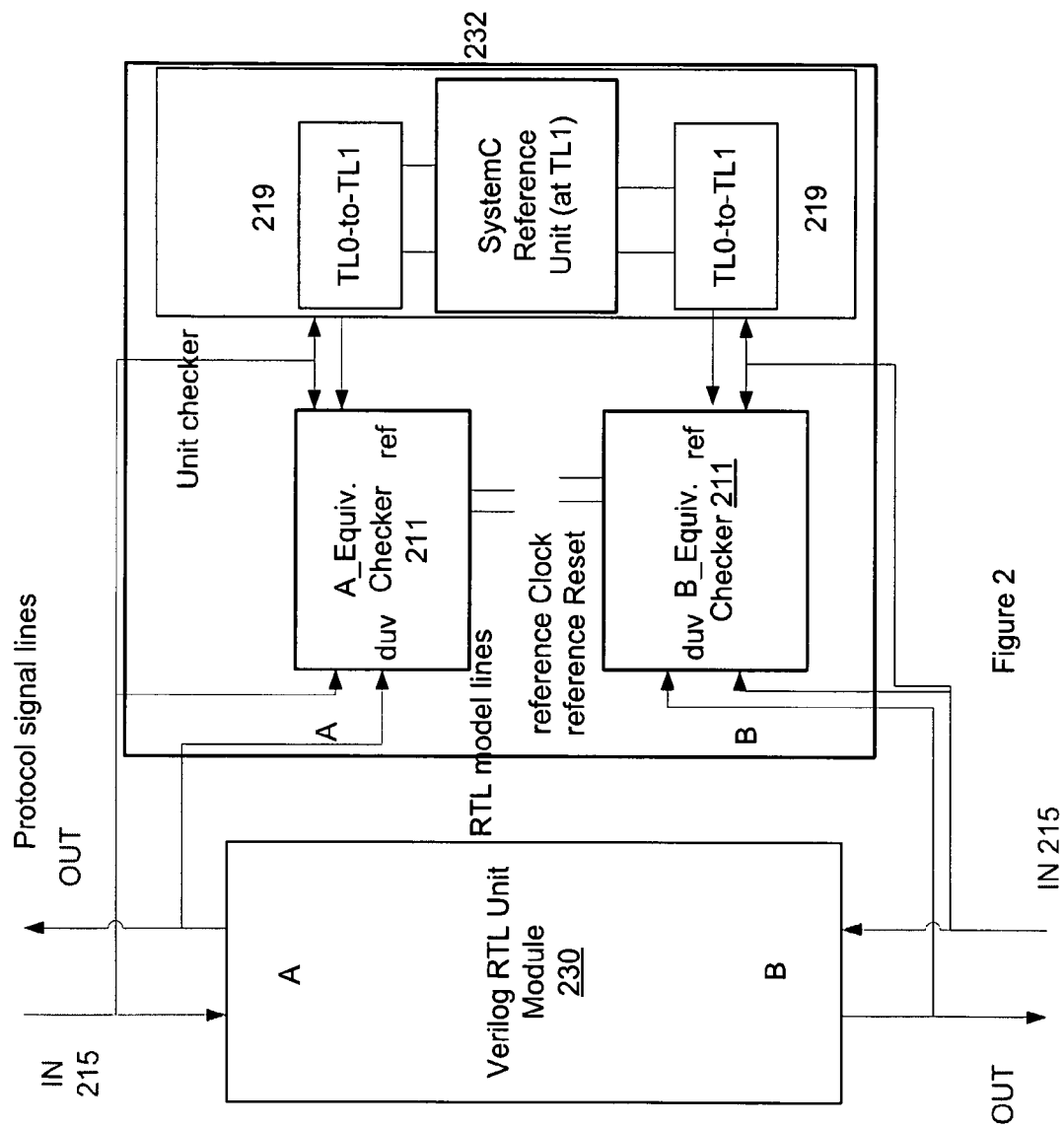
FIG. 2 illustrates a block diagram of an embodiment of one or more checker units configured to receive one or more input signals from the TL1-to-TL0 adapters wrapped around the model coded in the software programming language at TL1 and the model at RTL.

FIG. 2 illustrates a block diagram of an embodiment of one or more checker units configured to receive one or more input signals from both the TL1-to-TL0 adapter wrapped around the model coded in the software programming language at TL1 and the model at RTL.

Referring to FIG. 2, one or more equivalence checker units 211 receive an input signal from both the output of the TL1-to-TL0 adapter 219 wrapped around the model of one or more hardware components making up the interconnect coded in the software programming language at TL1 232 and the output of the model of one or more hardware components making up the interconnect coded in RTL 230. The equivalence checker unit 211 also receives an input from the RTL level protocol lines 215 to tell whether the components being monitored are in a protocol phase when a transfer is active (see also FIG. 4 the Mcmd line). The equivalence checker unit 211 contains code scripted to determine if the RTL code representing the one or more hardware components is behaving correctly as expected on a per cycle basis and whether the output of the RTL model 230 behavior matches the output from the TL1-to-TL0 adapter 219. Each individual model is programmed with protocol rules and is tested to create a systematic equivalence checking at each hardware interface based on their protocol rules. The signal pin inputs may be grouped according to the protocol such as in the interface arrows in FIG. 3 and FIG. 5.

In an embodiment where RTL models are generated according to a specific configuration, each equivalence checker unit 211 instance may be created at the end of the function creating an instance of the model (create_body for example) of the one or more hardware components/unit module. The equivalence checker unit interfaces are created dynamically based on interfaces of an instance object passed through the method to create variable port lists (createInterfaces( ) for example). The EDA tool checks what RTL signal pin/interfaces are connected to the model of one or more hardware components making up the interconnect coded in RTL 230 and creates such interfaces in the TL1-to-TL0 adapter 219. The Electronic Design Automation tool also creates equivalence checker unit instances for all valid interfaces.

Referring to FIG. 1, the EDA tool creates a Transaction Layer 0 (TL0) module that may be coded entirely as SystemC or as a Verilog shell module embedding SystemC components. The TL0 module may contain the equivalence checker 111s, the TL0-TL1 adapter 119, and the TL1 model 130. If applicable, the EDA tool deletes irrelevant output reference ports. The TL0 module is instantiated by the EDA design tool next to its corresponding model of one or more hardware components making up the interconnect under test coded at RTL 130. The signal interface of the TL0 module is exactly the same as that of the model of one or more hardware components making up the interconnect coded in RTL 130. The EDA tool checks what RTL signal pin/interfaces are connected to the model of one or more hardware components making up the interconnect coded in RTL 130 and creates such interfaces in checker unit module. The Electronic Design Automation tool connects the appropriate interfaces of equivalence checkers 111 and TL1-TL0 adapter 119 to the same bundle of the model of one or more hardware components making up the interconnect coded in RTL to allow the EDA design tool to configure the interfaces.

The EDA tool connects the checker unit 111 instance to the TL0 to TL1 adapter 119 connected to the model of one or more hardware components making up the interconnect coded in System C 132. Thus, interfaces of the same type from the one or more hardware components making up the interconnect under test 132, 130 and the TL0-TL1 adapter 119 are connected to the appropriate interface of the checker unit 111. This doesn't break the structure of the checker unit 111, as it has its own module writer, but helps to configure all interfaces automatically. The clock interface ports may be handled in a specific method for configuration as certain clock ports may be shared with another interface. Each checker unit instance 111 may contain information such as interface definitions, knowledge of the protocol, a unique name, etc.

In an embodiment, both the SystemC TL0 module and equivalence checker 111 may be coded in a hardware description language, such as Verilog, as modules. The Verilog TL0 shell module may consist of an empty module with ports and the following statement: (* integer foreign="SystemC"; *). The TL0 module has an attribute "is_systemc" and a reference to the one or more hardware components making up the interconnect under test module (module.ref). The EDA design tool checks for this attribute and, if set, writes the SystemC TL0 module using the reference to actual one or more hardware components making up the interconnect under test module. Additionally a Verilog shell is generated to enable the TL0 SystemC module instantiation in the Verilog.

As discussed, each individual C-model of one or more hardware components making up an interconnect coded in a software language at TL1 132 cooperates with the TL1-to-TL0 adapter wrapper 119 to produce timing and functional results that can be compared to be cycle accurate to the model of those one or more hardware components making up an interconnect coded in RTL 130. Accordingly, each individual SystemC programming language model of one or more hardware components making up an interconnect 132 may receive parameters for those hardware components to produce a unique instance based on the received parameter. The same parameters may have been used in the generation of the model of the one or more hardware components making up the model of the subcomponent of the interconnect in RTL 130.

The model in RTL 130 is fixed to a particular design. The cycle accurate SystemC-model 132 has a configurable cycle accurate system-level model compared to a "fix-to-a-design" C model extracted from the RTL instance directly because as the supplied parameters change a new instance of the C programming language model of the one or more hardware components having the new parameters may be readily produced. The TL1-to-TL0 abstraction adapter 119 allows an architect to design a model (at unit-level and system-level) to be adapted at run-time to all configurations based on supplied configuration parameters of the hardware protocol interfaces. A library of models/objects of the hardware components coded may exist to deal with all the possible configuration parameter possibilities of the device under test i.e. model of the one or more hardware components in RTL.

Figure 3:
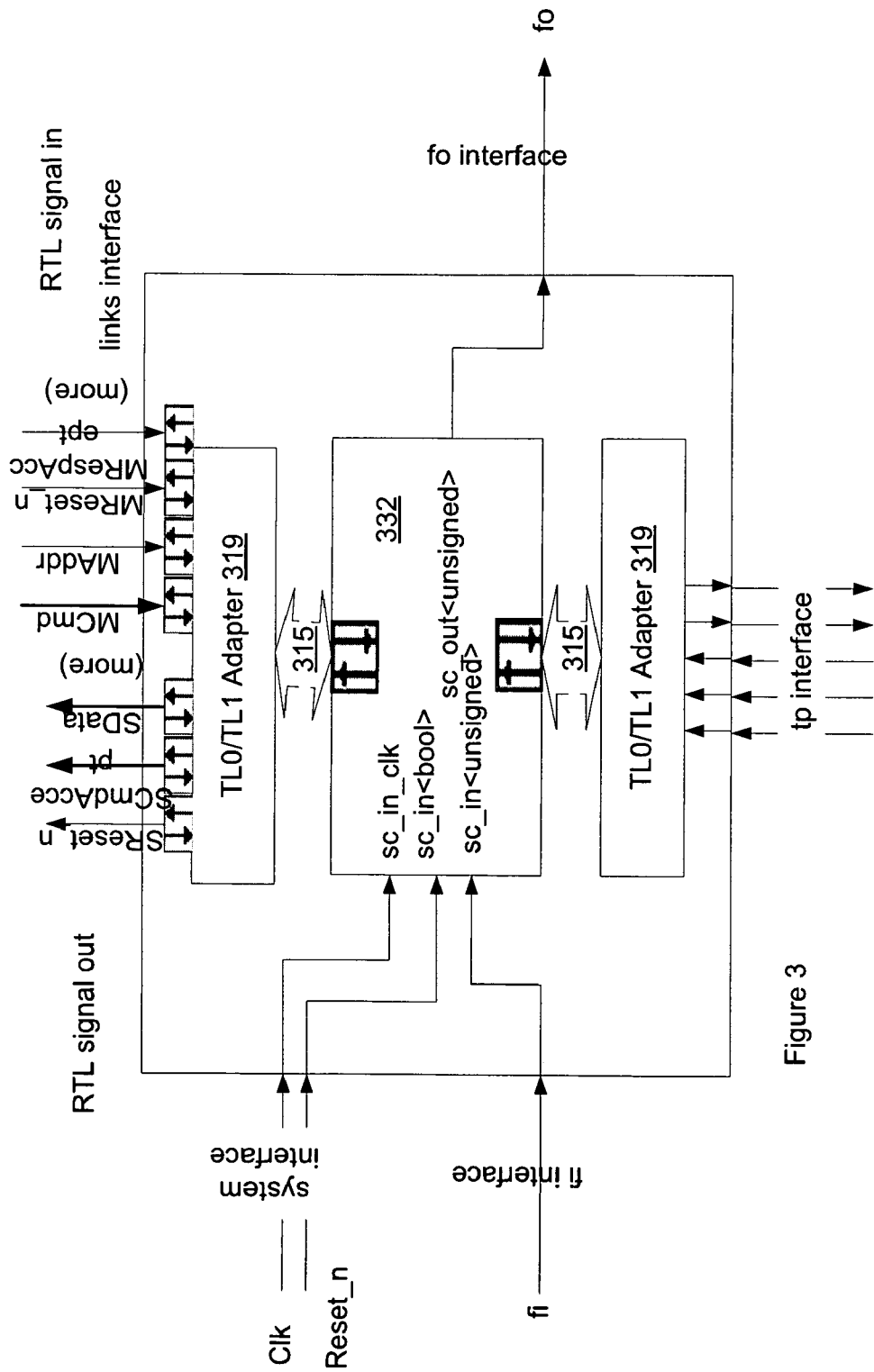
FIG. 3 illustrates a block diagram of an embodiment of a model at TL1 and coded with a protocol knowledge of phases of that protocol.

FIG. 3 illustrates a block diagram of an embodiment of a model at TL1 interfacing to one or more protocols and coded with a knowledge of the phases of these one or more protocols.

Referring to FIG. 3, a cycle accurate model of one or more hardware components making up an interconnect coded in a software programming language at a Transaction Layer 1 level (TL1) 332 coupled with a TL1-to-TL0 adapter 319 is useful in verification of RTL behavior, executed in the RTL model, such as validating signals in a RTL/software co-simulation. The TL1 model of the one or more hardware components may interact with its environment through TL1 channels 315. The TL1 channels 315 connect to the TL1-to-TL0 adapter 319.

The TL1 model of the one or more hardware components 332 is reusable by containing code to test all possible configurations of the one or more hardware components making up the interconnect under test, including Asynchronous/Divided-Clock interfaces. The TL1 model 332 allows modeling zero-latency and combinational paths across multiple interfaces. The TL1 model 332 may contain code representing the behavior of the internal structure of the one or more hardware components such as Request and Response Paths, Response Generation Path/Logic, Request Translation, Clocking Interface, Reset Logic, Programming Registers, Sidebands, Tie Offs, Power Management, Timeout Mechanism.

The cycle accurate model at TL1 332 also has a faster cycle accurate system-level model simulation time compared to an extracted C model from RTL design directly. The model at TL1 332 can be coded with a protocol knowledge of the phases of that protocol to be concerned with the response or request phase cycle start and end boundaries within the boundaries of the response phase or request phase occurring at the RTL level (see FIG. 4 for inputs on beginning and end event notification of the response phase or request phase occurring at the RTL level). This results in a faster time to run a simulation.

Additionally, the model at TL1 332 can also take advantage of passing a pointer through the modeled system rather than the data/full amount of bytes itself. Protocol signals may be grouped, such as all of the signals associated with a request, destination address signals, data type signals, thread identifier, command signals, type of request signals, priority/QOS information signals, etc., into a common software object that contains all of the grouped signal information. The pointer points to a request signal group structure containing two or more protocol signals and is all that needs to be passed through each leg of the simulated interconnect from the initiator model to the target model rather than all of the information in the request signal group structure. The C programming language model uses smart pointer concepts for dataflow abstraction including memory pools for small reallocated packets with current request group structures in use and request group structures awaiting to be reused, and shared pointers to pass information with few copies.

The cycle accurate model at TL1 332 allows abstraction of non-dataflow constructs such as sideband mapping, such as signal errors, interrupt signals, flags, etc., routed across the legs of the interconnect between an initiator and a target or vice versa. When modeling in SystemC, the models need only pass the information via function pointer and the proper timing for such sideband mapping information. A structure containing the sideband information then may call to the appropriate initiator or target model to supply the non data flow sideband information to abstract hardware flip-flop behavior.

Figure 4:
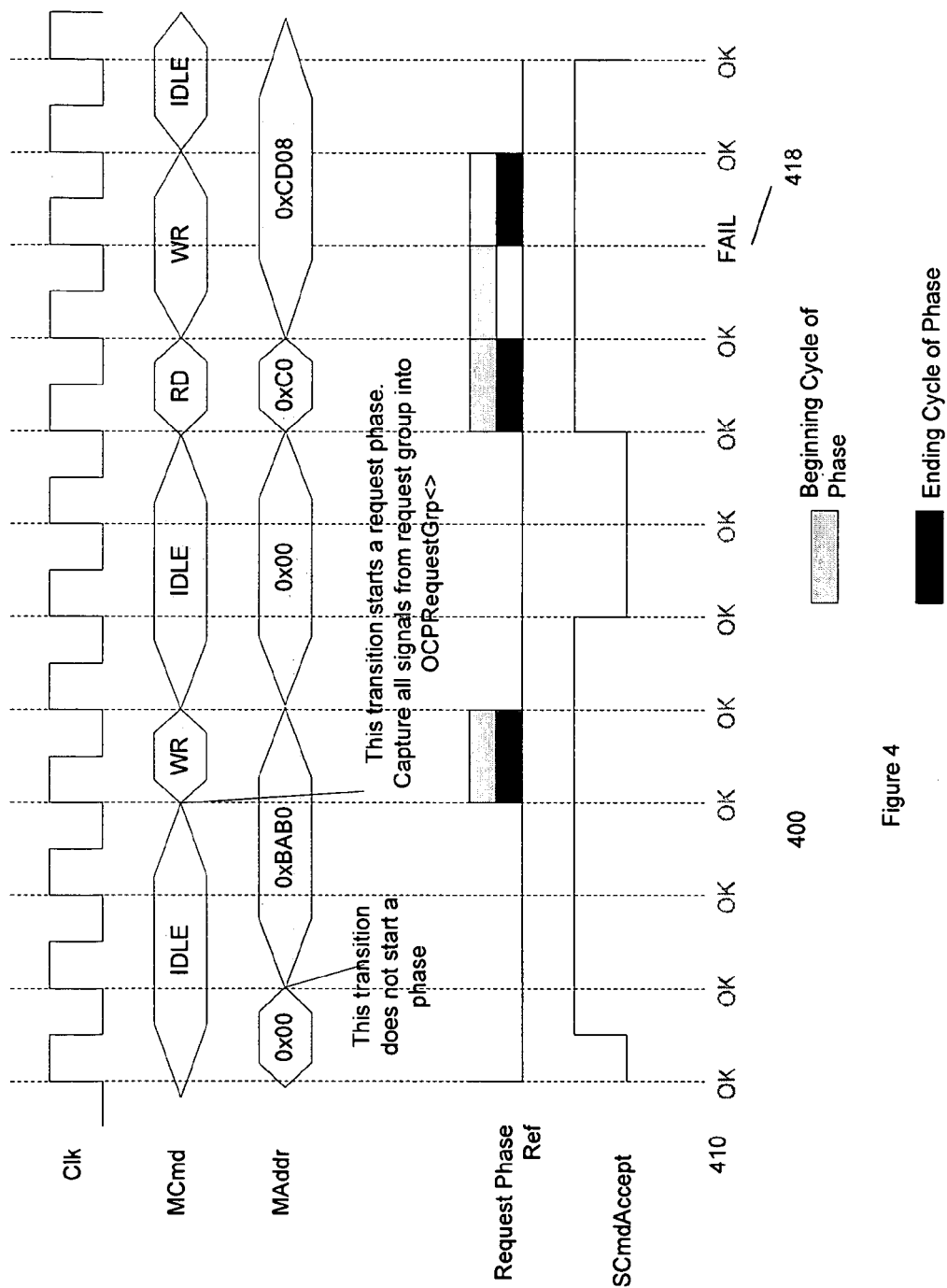
FIG. 4 illustrates a graph of an embodiment of systematic correlation.

FIG. 4 illustrates a graph of an embodiment of systematic correlation. The graph 400 shows various RTL signals such as a clock signal, a command signal, an address signal, and a command acceptance signal. The graph 400 also shows the beginning cycle of a phase and the ending cycle of a phase, on the Request Phase Ref line. Phase definitions of OCP, for example StartRequest, may be used to establish a systematic correlation using the example of the request phase. The transition of an example write request starts the request phase. The monitors capture all signals from the request group into an OCPRequestGrp<>structure. The precise protocol phase timing definitions allows for phase-accurate modeling. The simulator does not need to snoop or periodically check to see if an event occurs such as the monitored channel changes state from being idle to going active. When a change occurs on that monitored RTL signal line, a positive detection is noted because it's directly monitored. For example, the RTL signal line of MCmd changes states to indicate the event of the starting or ending of the request phase for that channel. Importantly, no checking or snooping has to occur by the simulator when the channel is idle, thereby reducing many cycle checks and increasing the simulation speed The monitors may capture all of the signals from the request group from different levels of abstraction of the sub component being correlated and then correlate those signals from the demarcation of the initiating event such as the transition of the example write request. This results in a per clock cycle correlation success or failure shown as attribute 410. The clock edge labeled 417 shows a mismatch that the modeling tool reports to the user.

The EDA tool creates and tests in parallel two models at different levels of abstraction with cycle accurate modeling with event notification in TL1 modeled unit or TL1 aggregation of individual modeled units. The event-driven programming may mean that an event message indicates something has happened, such as a phase start or end, so a simulator need not check for information on every cycle in every component in a simulation but rather interrogate for data or compute data merely when an event notification occurs. Basing calculation and processing resources on merely event notifications, decreases the time to run a simulation as well as the amount of processing power to run a simulation. The event notification may be a function call from the modeled component when the event occurs.

Figure 5:
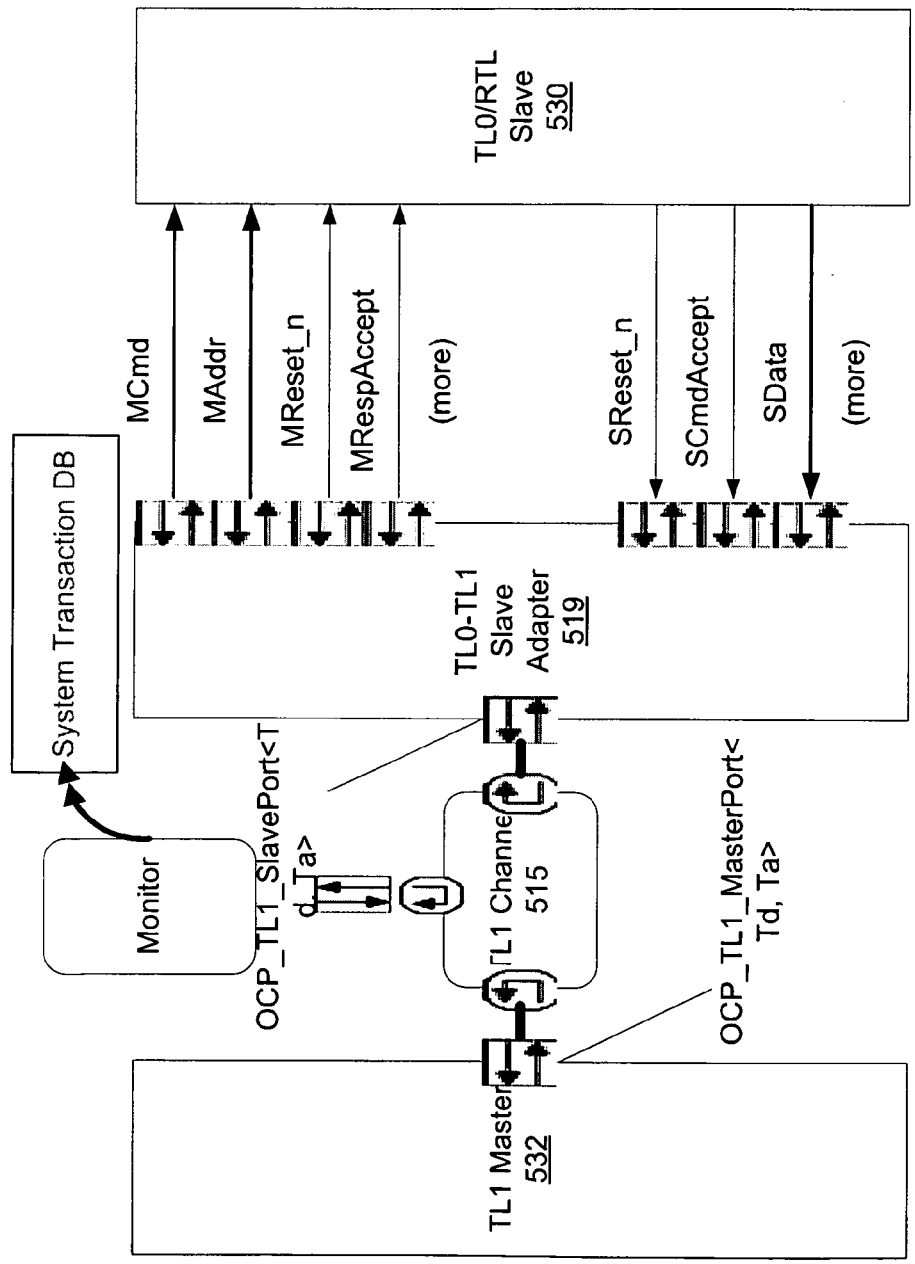
FIG. 5 illustrates a block diagram of an embodiment of a model at TL1 and a monitor program to read values stored in a TL channel between the model at TL1 and the TL1-TL0 adapter.

FIG. 5 illustrates a block diagram of an embodiment of a model at TL1 and a monitor program to read values stored in a TL channel between the model at TL1 and the TL1-TL0 adapter.

Co-simulation of a first model of one or more hardware components coded at RTL 230 with a second model of those one or more hardware components coded in SystemC 232 renders powerful SystemC debug and analysis methods relevant to RTL. A variety of debug and tracing methods available in the C programming language allows for complex debug and analysis, which then can be applied to the model of those one or more hardware components in SystemC and by proxy the co-simulated model in RTL. For example, online transaction viewing based on the SystemC abstract (TL1) interfaces, which is the SystemC part of the co-simulation, are applicable directly to RTL in real-time. The TL1-to-TL0 adapter 219 may be monitored for signals and those signals sent to debug and analysis tools in the C programming language.

FIG. 5 shows detail of the connectivity around a TL0-TL1 adapter. The TL0-TL1 adapter 519 has a phase accurate model Interface Port on one end, with its RTL signal counterparts, such as MCmd, MAddr, Sdata, etc., grouped as either input or output structures and is able to react to phase events occurring in the connected channel 515. The TL0-TL1 adapter 519 has a variable list of sc_in, sc_out ports on other end, to form its protocol interface at TL0. It shows how a first model at TL1 acting as a master on an OCP connection, can connect directly to a second model at RTL acting as slave on the same OCP connection.

In an embodiment, conventional approach in hardware design and modeling is to create a specification, write a system-level model, write hardware RTL units, and write hardware unit verification components. This leads to four implementation instances of a final product. Plus, all four implementation instances need to be upgraded in the same time, if needed. In the approach with the cycle accurate C-model, individual models at the TL1 level are verified at the unit/group level and then aggregated together to form the system level model at the TL1 level. A designer has a specification of an interconnect with user supplied configuration parameters that has to be coded, writes hardware units in RTL that has to be coded, write hardware unit's in SystemC as well as supplies verification components (unit checkers), then, aggregates the individual SystemC modeled components into a system-level model of an interconnect. A separate system level C-model need not be written from scratch because the earlier coded work is aggregated into the system-level C-model. The approach with the cycle accurate C-model has only three implementation instances and has been correlated to the hardware coded at RTL to be cycle accurate to the hardware coded at RTL.

In an aggregate system-level model of an interconnect in a software programming language where the sub-components are models of one or more hardware components, the sub-components are connected by channels identical to the channel 135 used between a model of one or more hardware components in SystemC 132 and a TL0-TL1 adapter 119.

Figure 8:
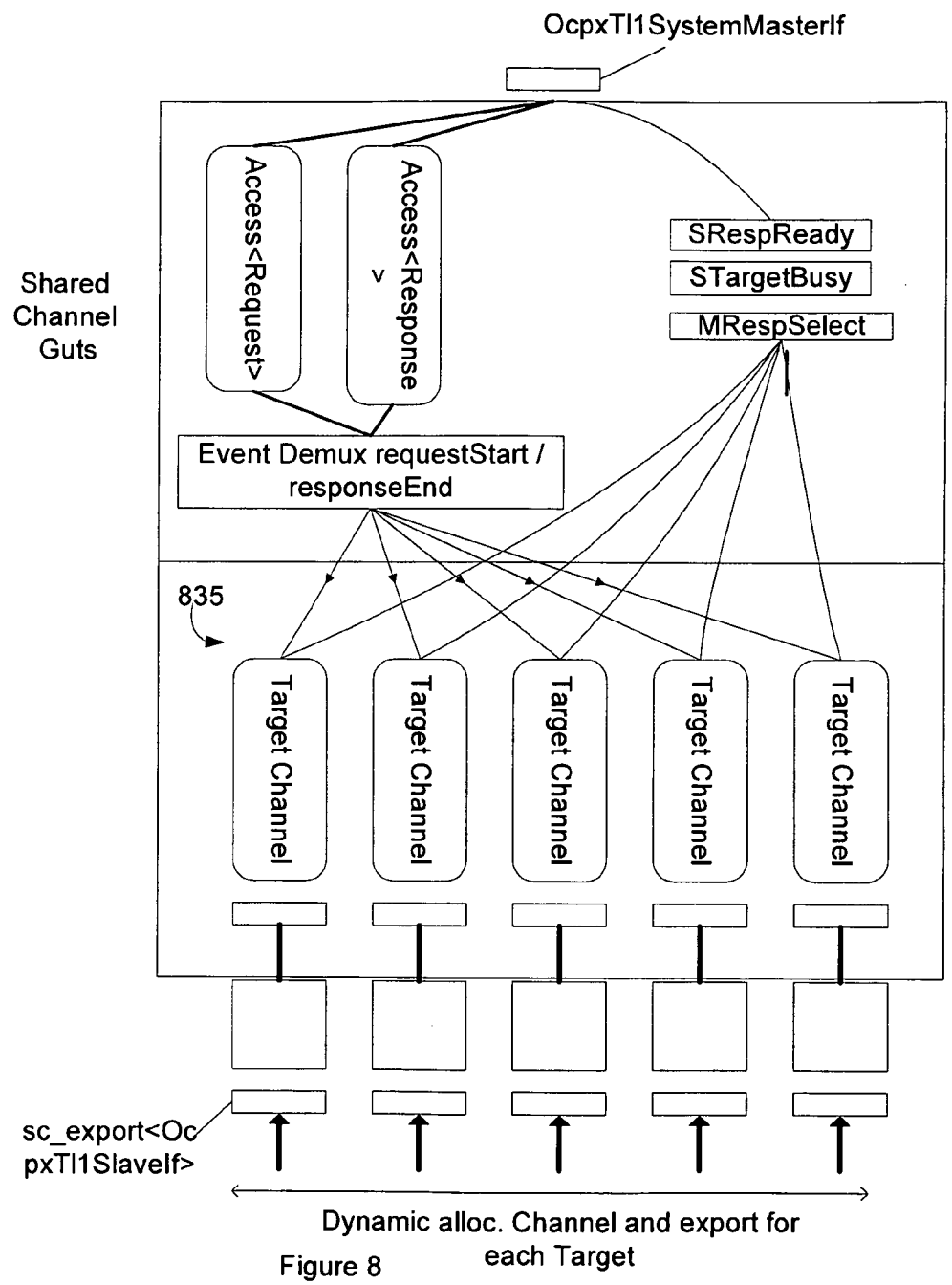
FIG. 8 illustrates a block diagram of an embodiment of an aggregated model of an entire set of hardware components connecting its subcomponents with channels that vehicle transactions at TL1 in a combinatorial fashion.

In an embodiment of an aggregated system-level model of an interconnect in a software programming language, the protocol between sub-components may require a more complex connectivity than a mere point to point connection. For example, the hardware interconnect being modeled may use a branching scheme—combinatorial multiplexed connectivity 835 from one interface to many. Such a combinatorial multiplexed connection 835 can be implemented as a hierarchical channel implementing the interfaces of each end of the branch as shown in FIG. 8.

Thus, the aggregated model of an entire set of hardware components may connect its subcomponents with channels that vehicle transactions at TL1 in a combinatorial fashion, such as channels implementing point to point connections or other combinatorial schemes, in order to connect multiple sub-components in a fashion similar to the hardware interconnect being modeled.

Figure 6:
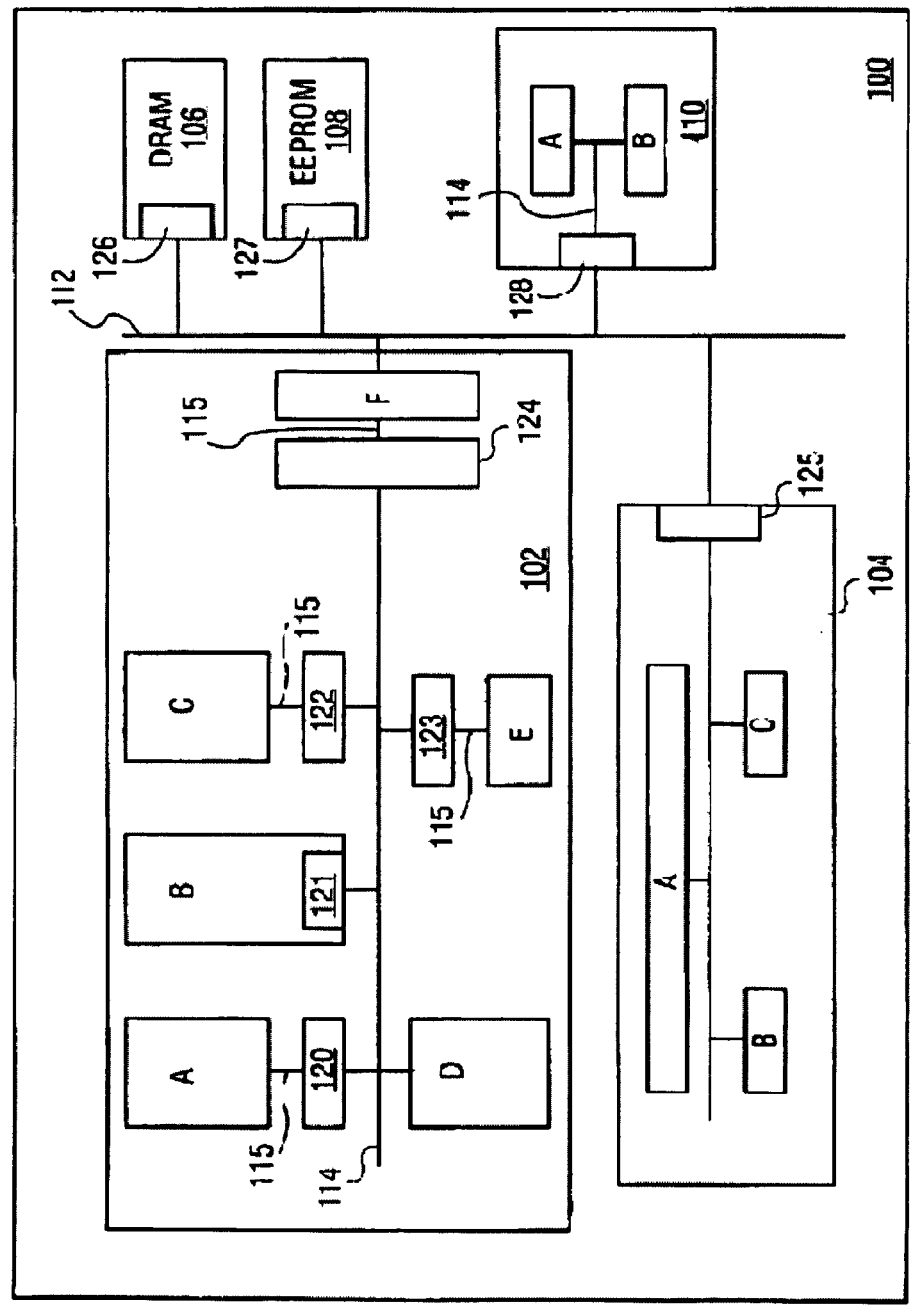
FIG. 6 illustrates a block diagram of an embodiment of a complex electronics system.

FIG. 6 is a block diagram of a complex electronics system 100. Shared communications bus 112 connects sub-systems 102, 104, 106, 108, and 110. Sub-systems are typically functional blocks including an interface module for interfacing to a shared bus. Sub-systems may themselves include one or more functional blocks and may or may not include an integrated or physically separate interface module. In one embodiment, the sub-systems connected by communications bus 112 are separate integrated circuit chips. In another embodiment, the sub-systems connected by communications bus 112 are Intellectual Property cores on a system on a chip.

For example, Sub-system 104 may be an application specific integrated circuit (ASIC), which is an integrated circuit, designed to perform a particular function. Sub-system 106 is a dynamic random access memory (DRAM). Sub-system 108 is an erasable, programmable, read only memory (EPROM). Sub-system 110 is a MPEG decoder block. Sub-system 102 is a fully custom integrated circuit designed specifically to operate in system 100. Other embodiments may contain additional sub-systems of the same types as shown, or other types not shown. Other embodiments may also include fewer sub-systems than the sub-systems shown in system 100. Integrated circuit 102 includes sub-systems 102A, 102B, 102C, 102D and 102E as well as other internal subsystems such as merger units, splitter units, and internal buffering. ASIC 104 includes functional blocks 101A, 104B and 104C. FPGA 110 includes functional blocks 110A and 110B. A functional block may be a particular block of logic that performs a particular function, a memory component on an integrated circuit, etc.

System 100 is an example of a system that may consist of one or more integrated circuits, chips, or functional IP cores on a single chip. A functional block may be a logic block on an integrated circuit such as, for example, functional block 102E, or a functional block may also be an integrated circuit such as fully custom integrated circuit 102 that implements a single logic function.

Shared communications bus 112, such as a system on a chip interconnect, provides a shared communications bus between sub-systems of system 100. Shared communication bus 114 provides a shared communications bus between sub-systems or functional blocks on a single integrated circuit. Some of the functional blocks shown are connected to interface modules through which they send and receive signals to and from shared communications bus 112 or shared communications bus 114. Interconnect 115 is a local point-to-point interconnect for connecting interface modules to functional blocks.

Interface modules 120-127 are connected to various functional blocks as shown. In this embodiment, interface modules 120, 122, 123 and 124 are physically separated from their connected functional block (A, B, C, E and F, respectively). Interface modules 121, and 125-128 are essentially part of their respective functional blocks or sub-systems. Some functional blocks, such as 102D, do not require a dedicated interface module. The arrangement of sub-systems, functional blocks and interface modules is flexible and is determined by the system designer.

In one embodiment there are four fundamental types of functional blocks. The four fundamental types are initiator, target, bridge, and snooping blocks. A typical target is a memory device, a typical initiator is a central processing unit (CPU). However any block may be a target or an initiator. A typical bridge might connect shared communications buses 112 and 114. Functional blocks all communicate with one another via shared communications bus 112 or shared communications bus 114 and the protocol of one embodiment. Initiator and target functional blocks may communicate a shared communications bus through interface modules. An initiator functional block may communicate with a shared communications bus through an initiator interface module and a target functional block may communicate with a shared communications bus through a target interface module. An initiator interface module issues and receives read and write requests to and from functional blocks other than the one with which it is associated. In one embodiment, an initiator interface module is typically connected to a CPU, a digital signal processing (DSP) core, or a direct memory access (DMA) engine.

Note, the interconnect shown in FIG. 6 illustrates a bus based interconnect. However, the interconnect may be implemented in many ways such as switched or routed networks.

Figure 7:
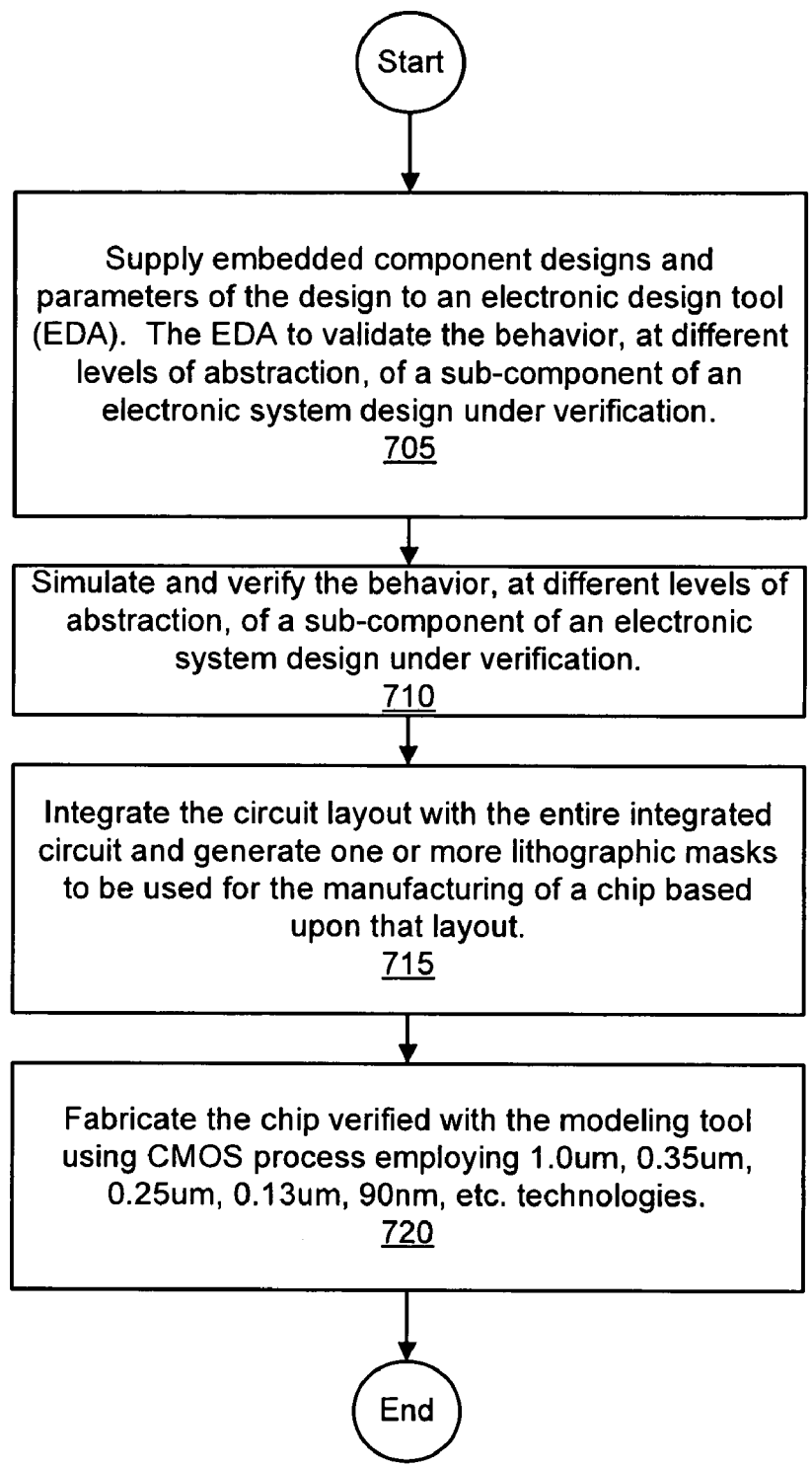
FIG. 7 illustrates a flow chart of an embodiment of verifying and generating various electronic design systems.

FIG. 7 illustrates a flow chart of an embodiment of verifying and generating various electronic design systems. The information representing the apparatuses and/or methods may be contained in a modeling tool. The information representing the apparatuses and/or methods stored on the machine-readable medium may be used in the process of creating the apparatuses and/or methods described herein.

The modeling tool may be used for verifying highly configurable, scalable System On a Chip sub components. In an embodiment, an example modeling tool may include the following: a graphic user interface; a common set of processing elements; and a library of files containing design elements such as circuits, control logic, and cell arrays. Traditionally, there exist two major stages of SOC design: front-end processing and back-end programming. Front-end processing consists of the design and architecture stages, which includes design of the SOC schematic. The front-end processing may include connecting models, configuration of the design, simulating and tuning during the architectural exploration. The design is simulated and tested. Front-end processing traditionally includes simulation of the circuits within the SOC and verification that they work correctly. The integration of the electronic circuit design may include packing the cores, verifying the cores, simulation and debugging. The tested and verified components then may be stored as part of a library. The modeling tool that can be used for verification and validation of an electronic system design, as well as other applications.

Back-end programming traditionally includes programming of the physical layout of the SOC such as placing and routing, or floor planning, of the circuit elements on the chip layout, as well as the routing of all interconnects between components. Thus, the floor plan may be generated imported and edited. After this, the design may be outputted into a Netlist of one or more hardware design languages (HDL) such as Verilog, VHDL (Very-High-Speed Integrated Circuit Hardware Description Language) or SPICE (Simulation Program for Integrated Circuit Emphasis). A Netlist describes the connectivity of an electronic design such as the components included in the design, the attributes of each component and the interconnectivity amongst the components. After the Netlist is generated, synthesizing of the design with Register Transfer Level (RTL) may occur. Accordingly, back-end programming further includes the physical verification of the layout to verify that it is physically manufacturable and the resulting SOC will not have any function-preventing physical defects. The front-end views support documentation, simulation, debugging, and testing. The back-end files, such as a layout, physical Library Exchange Format (LEF), etc are for layout and fabrication.

In block 705, the electronic system design as well as other embedded component designs parameters are supplied to the modeling tool. The modeling tool may include object code in a set of executable software programs in order to run actual operation and configuration simulations. The modeling tool will be used to validate the behavior, at different levels of abstraction, of a sub-component of an electronic system design under verification.

In block 710, the modeling tool may provide test data to validate, verify and debug the designs by simulating and verifying the operation of each sub-component of an electronic system design under verification at different levels of abstraction. The machine may also generate simulations of representations of the circuits described above that can be functionally tested, timing tested, debugged and validated.

The modeling tool may have its instructions, executable code sequences, data files, etc stored on a machine-readable storage medium. A machine-readable storage medium may include any mechanism that provides (e.g., stores and/or transmits) information in a form readable by a machine (e.g., a computer). For example, a machine-readable medium may include, but is not limited to: read only memory (ROM); random access memory (RAM); magnetic disk storage media; optical storage media; flash memory devices; DVD's; electrical, optical, digital signals); EPROMs; EEPROMs; FLASH, magnetic or optical cards; or any other type of media suitable for storing electronic instructions.

In block 715, the circuit layout of a verified IP block may be integrated with the entire integrated circuit. One or more lithographic masks may be generated from to be used for the manufacturing of a chip based upon that layout.

In block 720, the chip verified with the modeling tool may be fabricated using CMOS process employing 1.0 um, 0.35 um, 0.25 um, 0.13 um, 90 nm, etc. technologies.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

SystemC may include a set of library routines and macros implemented in C++, which makes it possible to simulate concurrent processes, each described by ordinary C++ syntax. Instantiated in the SystemC framework, the objects described in this manner may communicate in a simulated real-time environment, using signals of all the data types offered by C++, some additional ones offered by the SystemC library, as well as user defined. The behaviors (processes) defined may be instantiated any number of times, and provisions are made for processes defined by hierarchies of other processes, as one would expect. The language thus offered has semantical similarities to VHDL and Verilog, but may be said to have a syntactical overhead compared to these.

On the other hand, greater freedom of expressiveness is offered in return, like object oriented design partitioning, template classes and dynamic memory allocation. Which is more: SystemC is both a description language and a simulation kernel. The code written will compile together with the library's simulation kernel to give an executable that behaves like the described model when it is run. The performance of this simulation kernel is not to be compared with that of commercial VHDL/Verilog simulators at the present.

Transaction-level modeling (TLM) is a high-level approach to modeling digital systems where details of communication among modules are separated from the details of the implementation of functional units or of the communication architecture. Communication mechanisms such as busses or FIFOs are modeled as channels, and are presented to modules using SystemC interface classes. Transaction requests take place by calling interface functions of these channel models, which encapsulate low-level details of the information exchange. At the transaction level, the emphasis is more on the functionality of the data transfers—what data are transferred to and from what locations—and less on their actual implementation, that is, on the actual protocol used for data transfer. This approach makes it easier for the system-level designer to experiment, for example, with different bus architectures (all supporting a common abstract interface) without having to recode models that interact with any of the buses, provided these models interact with the bus though the common interface.

High-level system description methodologies can allow designers and system architects to modify the traditional system design approach. Some languages, such as SystemC, may allow system architects to model a circuit or system at a transaction-level in order to test the specified functionality and get early performance reports. The traditional design cycle still follows or often runs concurrently with this architectural modeling. The design will be written in a hardware description level usually at RTL (register transfer level) to be synthesized and finalized into silicon. This brings up the need for a correlation of disparate descriptions of the same circuit or system. The problem can be turned around chronologically as well but with the same verification challenges. Silicon IP vendors may be required to provide a transaction-level model of their part in order for their customers to realize a high-level simulation of a system embedding the part. This means that an existing design with a RTL description may need to be modeled at the transaction-level.

The testbench executable program may include code scripted as a sequence of test patterns and expected test results used to validate the behavior of the sub-components. A same instance of the test bench executable program may provide the sequence of test patterns and expected test results to validate the modeled sub-components at the different levels of abstraction. Thereby, eliminating a need to generate a new instance of the test bench executable program for each different level of abstraction of a design to be tested. A transactor may translate a behavior of the one or more sub-components between the one or more different levels of abstraction derived from the same electronic system design based upon an applied sequence of test patterns and expected test results from the same instance of the testbench executable program.

As discussed, many electronic system designs are written at a Register-transfer level (RTL) description of a circuit or system in a hardware description language. Generally, a RTL description describes what intermediate information (i.e. information stored between clock cycles in an electronic circuit) is stored in registers, where it is stored within the design, and how that information moves through the design as it operates. The RTL description of an electronic system is a functional description at least one level of abstraction higher than the individual gate layout of the electronic design system (e.g., gate-level implementation/Netlist). The RTL description fully and explicitly describes virtually all of the logic and sequential operations of the circuit. RTL descriptions are commonly written in standard languages such as Verilog or VHDL and are intended for logic synthesis and mapping with a commercial logic synthesizer.

The one or more hardware components making up the interconnect under test is generally a sub component of the electronic design system and described as an abstract executable representation that may include a hierarchical set of subroutines or classes in a programming language, or modules (Verilog) or entities (VHDL) in a hardware description language. There may be a need to validate two or more descriptions of the same circuit or system. With the complexity of modern systems, the verification process that consists of developing a complete testbench for the system is long and costly. It is accounted for with the same care as the resources and schedule allocated to the design of the system itself.

While some specific embodiments of the invention have been shown the invention is not to be limited to these embodiments. For example, the electronic circuit design under test may provide a different purpose and function than an interconnect communication bus. The EDA tool and the second model may be scripted in any number of programming languages. Also, most functions performed by electronic hardware components may be duplicated by software emulation. Thus, a software program written to accomplish those same functions may emulate the functionality of the hardware components. The hardware logic consists of electronic circuits that follow the rules of Boolean Logic, software that contain patterns of instructions, or any combination of both. The invention is to be understood as not limited by the specific embodiments described herein, but only by scope of the appended claims.

We claim:

1. A computer-generated method, comprising:
generating a model of hardware components making up an interconnect that facilitates communications between IP blocks in an integrated circuit coded in a software programming language at a high level of abstraction that is cycle accurate to a corresponding lower level of abstraction description of the hardware components making up the interconnect;
simulating sub-components of the model at the high level of abstraction in parallel with the same sub-components of a model coded in a hardware description language at the low level of abstraction to verify the functional accuracy and cycle timing between the two models; and
after simulating the sub-components, aggregating the sub-components of the model at the high level of abstraction into a single model at the high level of abstraction that is functionally accurate and cycle accurate to the model at the low level of abstraction, wherein the generating, simulating and after simulating are performed by a computing device.

2. The computer-generated method of claim 1, further comprising:
monitoring, using event notification and coded-in knowledge of phases of a protocol to monitor response and request phase cycle start and end boundaries rather than every transition within the boundaries of the response phase or request phase occurring at the RTL level;
reading two or more data sets, containing responses, at the high and the lower different levels of abstraction, to requests sent by a testbench executable program;
determining an equivalence of the responses found in the two or more data sets for each level of abstraction of the sub-components, where equivalence is established at a phase level, wherein the lower level of abstraction is RTL and the high level of abstraction is TL1; and
correlating functionality and cycle timing between the model at the RTL level of abstraction and the model at TL1 level of abstraction.

3. An apparatus produced by the method of claim 1.

4. The computer-generated method of claim 1, where the high level of abstraction is coded in a software programming language at a Transaction Layer 1 level (TL1) and is cycle accurate to the low level of abstraction, which corresponds to a Register Transfer Level (RTL) description of the hardware components making up the interconnect; and
using a TL1-to-TL0 adapter wrapped around each individual model of the one or more hardware components making up an interconnect coded in the software programming language at TL1 in order to provide output signals that are cycle accurate compared to the model of the one or more hardware components making up an interconnect coded in RTL.

5. The computer-generated method of claim 4, further comprising:
receiving an input signal from both output signals of the TL1-to-TL0 adapter wrapped around the model coded in the software programming language at TL1 and output signals of the model at RTL, and determining whether the RTL code representing the one or more hardware components is behaving as expected on a per cycle basis and whether the output of the RTL behavior matches output signals from the model coded in the software programming language at TL1, via the TL1-to-TL0 adapter.

6. The computer-generated method of claim 4, further comprising:
receiving an input from one or more protocol lines to tell whether components being monitored are idle or are in an active phase;
wherein each individual model coded in the software programming language at TL1 is programmed with protocol rules and is tested to create a systematic equivalence checking at each hardware interface based on their protocol rules; and checking what RTL signal pins are connected to the model of one or more hardware components making up the interconnect coded in RTL and creating a similar interface for checker units.

7. The computer-generated method of claim 4, wherein the cycle-accurate model coded in the software programming language at TL1 is configured to pull parameters of the model at RTL at run time based on supplied configuration parameters of the hardware protocol interfaces to support all possible configuration parameter possibilities, and wherein the model coded in the software programming language passes a pointer through each leg of the simulated interconnect between models of the IP blocks in the integrated circuit, the pointer points to a protocol signal group structure containing representations of two or more protocol signals.

8. The computer-generated method of claim 4, wherein individual models of one or more components at the TL1 level are initially verified and then aggregated together with other models of one or more components at the TL1 level to form the model of the entire set of the hardware components making up the interconnect that facilitates communications between the IP blocks in the integrated circuit coded in the software programming language at TL1 that is cycle accurate to the corresponding RTL description.

9. The computer-generated method of claim 4, wherein the aggregated model of the entire set of hardware components connects its subcomponents with channels that vehicle transactions at TL1 in a combinatorial fashion to connect multiple sub-components in a fashion similar to the hardware interconnect being modeled.

10. The computer-generated method of claim 4, generating of a representation of hardware components, further comprising:

one or more checker units configured to receive one or more input signals from both the TL1-to-TL0 adapter wrapped around the model coded in the software programming language at TL1 and the model at RTL, wherein each checker unit contains code scripted to determine whether the RTL code representing the one or more hardware components is behaving as expected on a per cycle basis and whether the output of the RTL behavior matches output signals from the model coded in the software programming language at TL1, via the TL1-to-TL0 adapter.

11. The computer-generated method of claim 4, generating of a representation of hardware components, further comprising:

one or more checker units configured to receive one or more input signals from both the TL1-to-TL0 adapter wrapped around the model coded in the software programming language at TL1 and the model at RTL to verify the model at TL1 correlates accurately with respect to functionality and cycle timing to the model at RTL.

12. The computer-generated method of claim 4, wherein the model of the one or more hardware components making up the interconnect coded in the software programming language at TL1 is coded with a protocol knowledge of phases of that protocol concerned with a response or request phase cycle start and end boundaries rather than every transition within the boundaries of the response phase or request phase occurring at the RTL level.

13. The computer-generated method of claim 4, wherein the model coded in the software programming language passes a pointer through each leg of the simulated interconnect between models of the IP blocks in the integrated circuit, wherein the pointer points to a protocol signal group structure containing representations of two or more protocol signals and the pointer is passed rather than all of the information contained in the request signal group structure.

14. The computer-generated method of claim 4, wherein the model coded in the software programming language is coded to abstract non-dataflow constructs because the model merely needs to pass information via a function pointer and proper timing information for the non-dataflow constructs.

15. The computer-generated method of claim 14, wherein RTL signal pins connected to the model of one or more hardware components making up the interconnect at RTL are matched in signal pins of the TL1-to-TL0 adapter, the TL1-to-TL0 adapter is configured to pull parameters of the model at RTL at run time based on supplied configuration parameters of the hardware protocol interfaces to support all possible configuration parameter possibilities, and the checker units also receive an input from the protocol lines to tell whether components being monitored are idle or are in a protocol phase when a transfer is active.

* * * * *